United States Patent
Chennakeshu et al.

(10) Patent No.: US 6,192,503 B1
(45) Date of Patent: Feb. 20, 2001

(54) COMMUNICATIONS SYSTEM AND METHODS EMPLOYING SELECTIVE RECURSIVE DECODING

(75) Inventors: Sandeep Chennakeshu, Cary, NC (US); Amer A. Hassan, Kirkland, WA (US)

(73) Assignee: Ericsson Inc., Research Triangle Park, NC (US)

(*) Notice: Under 35 U.S.C. 154(b), the term of this patent shall be extended for 0 days.

(21) Appl. No.: 08/911,149

(22) Filed: Aug. 14, 1997

(51) Int. Cl.$^7$ .................................................. H03M 13/03
(52) U.S. Cl. ........................... 714/796; 714/780; 714/755
(58) Field of Search .................... 714/796, 794, 714/795, 758, 798, 755, 746, 780, 787; 341/106, 67

(56) References Cited

U.S. PATENT DOCUMENTS

| | | | |
|---|---|---|---|
| 4,622,670 | * 11/1986 | Martin | 371/43 |
| 4,852,102 | * 7/1989 | Yamaguchi | 371/40 |
| 5,430,744 | * 7/1995 | Fettweis et al. | 714/795 |
| 5,446,747 | 8/1995 | Berrou | 714/788 |
| 5,559,831 | * 9/1996 | Keith | 375/240 |
| 5,721,745 | * 2/1998 | Hladik et al. | 714/786 |
| 5,734,962 | * 3/1998 | Hladik et al. | 455/12.1 |
| 5,844,946 | * 12/1998 | Nagayasu | 375/341 |
| 5,894,473 | * 4/1999 | Dent | 370/342 |
| 5,905,742 | * 5/1999 | Chennakeshu et al. | 375/222 |
| 5,983,385 | * 11/1999 | Khayrallah et al. | 714/755 |
| 6,023,783 | * 2/2000 | Divsalar et al. | 714/792 |
| 6,038,695 | * 3/2000 | Pehkonen | 714/786 |

OTHER PUBLICATIONS

Redinbo (Decoding Real–Number Convolutional Codes: Change Detection, Kalman Estimatio. IEEE, Nov. 1997).*
Robertson (Improving Decoder And Code Structure Of Parallel Concatenated Recursive Systematic (Turbo) Codes. IEEE, Oct. 1994).*
Jung (Comparison Of Turbo–Code Decoders Applied To Short Frame Transmission System. IEEE, Apr. 1996).*

* cited by examiner

Primary Examiner—Albert De Cady
Assistant Examiner—Guy Lamarre
(74) Attorney, Agent, or Firm—Myers Bigel Sibley & Sajovec (57) ABSTRACT

A source sequence of symbols is communicated over a communications medium by encoding the source sequence according to respective first and second error correction codes to produce respective first and second encoded sequences of symbols. The first and second encoded sequences are processed to produce a communications signal, which is then communicated over the communications medium. The communicated communications signal is processed to produce first and second received sequences of symbols corresponding to the first and second encoded sequences, respectively. The first and second received sequences are selectively recursively decoded according to the associated error correction codes augmented by previous estimates of a symbol of the source sequence to repeatedly produce revised estimates of the symbol until an estimate satisfying a predetermined reliability criteria is obtained.

29 Claims, 8 Drawing Sheets

COMMUNICATIONS SYSTEM AND METHODS EMPLOYING SELECTIVE RECURSIVE DECORDING

FIELD OF THE INVENTION

The present invention relates to communications systems and methods, in particular, to communications systems and methods employing error correction.

BACKGROUND OF THE INVENTION

In a typical communications system, information is transmitted from a sender in the form of a communications signal representing the information. The communications signal typically is communicated to a receiving unit over a communications medium such as a radio, optical fiber, coaxial cable or similar link, which may introduce disturbances such as noise, delay, and distortion in the communications signal. These disturbances can induce errors when recovering the original information from the communicated communications signal at the receiving unit.

Conventional responses to overcome this problem include increasing the power level of the transmitted communications signal in order to increase the probability that the original information may be recovered. However, the ability to increase transmitter power may be limited due to power limitations of transmitter electronics, regulations on peak signal power levels and constraints on the power available for transmitting, for example, power supply limitations in devices such as mobile radiotelephones and satellites.

Redundancy may be introduced into a communications signal by using error control coding techniques. Redundant symbols supplied in a code such as block or convolutional code can provide an additional "separation" between the words of the set of code words, thus allowing a receiver which receives a group of symbols over a noisy communications channel to more easily discriminate between words of the set of code words, typically by determining which member of the set of code words most closely resembles the received group of symbols.

Many error control codes are effective at correcting random errors, e.g., errors which affect individual symbols in a random distributed fashion, while others are effective at compensating for so-called "burst" errors, e.g., errors which persist over several consecutive symbols. To compensate for burst errors, many systems employ interleaving which reorders symbols in a stream such that burst errors are more randomly distributed, for example, by using a device which stores the symbol stream in a matrix by rows and then retrieves the stored symbols by columns, such that the sequence retrieved from the device represents a reordering of the original input sequence. To combat random and burst errors, a system may employ a combination of random error correction encoding and interleaving, for example a cascade of a binary convolutional code and an interleaver, or a so-called "turbo coding" scheme, as described in U.S. Pat. No. 5,446,747 to Berrou et al. Turbo coding schemes typically employ a first code to encode a source data stream and a second code to encode an interleaved version of the source data stream to produce first and second encoded streams which are multiplexed and communicated over a channel. The received data stream typically is demultiplexed and decoded by first and second decoders employing the first and second codes, with appropriate interleaving and deinterleaving, with the output of one decoder being used to aid the other decoder in decoding the demultiplexed sequences in an iterative fashion.

While techniques such as turbo-coding are generally effective at reducing error rates for information communicated over a channel, conventional decoding schemes may not optimally decode the received information under various channel conditions. Turbo-coding can provide improved power efficiency, but may involve a large number of computations which may be unnecessary under favorable channel conditions and which may unnecessarily consume power.

SUMMARY OF THE INVENTION

In light of the foregoing, it is an object of the present invention to provide communications systems and methods which more efficiently decode communications signals representing parallel encoded source sequences.

This and other objects features and advantages are provided according to the present invention by communications systems and methods in which a communications signal representing a parallel encoded source sequence is selectively recursively decoded to produce estimates of a symbol in the source sequence based on a respective reliability associated with a respective revised estimate of the symbol. Preferably, the communications signal is processed to produce first and second sequences corresponding to the first and second error correction codes used to produce the communications signal, and then the received sequences are decoded in respective first and second soft output decoders. In a respective soft output decoder, a sequence is decoded according to the corresponding error correction code, augmented by previous estimates produced by the other decoder. Preferably, one of the first and second soft output decoders is chosen to first estimate the symbol based on a signal characteristic, e.g., signal strength, associated with the first and second received sequences. A selected group of symbols or bits of the source sequence, for example, a group of less significant symbols or bits, may be nonrecursive decoded, while another group of symbols or bits, for example, a group of more significant symbols or bits, may be selectively recursively decoded. Efficient techniques for decoding parallel encoded signals are thereby provided.

In particular, according to the present invention, a communications system includes encoding means for encoding a source sequence according to respective first and second error correction codes to produce respective first and second encoded sequences of symbols. Communications symbol processing means are responsive to the encoding means for processing the first and second encoded sequences to produce a communications signal. Communications signal communicating means are responsive to the communications symbol processing means for communicating the communications signal over a communications medium, and communications signal processing means are responsive to the communications signal communicating means for processing the communicated communications signal to produce first and second received sequences of symbols corresponding to the first and second encoded sequences, respectively. Selective recursive decoding means are responsive to the communications signal processing means for selectively recursively decoding the first and second received sequences according to the respective first and second codes augmented by previous estimates of a symbol of the source sequence to repeatedly produce revised estimates of the symbol until a revised estimate satisfying a predetermined reliability criterion is obtained.

The encoding means may include first encoding means for encoding the source sequence according to the first error correction code to produce the first encoded sequence, and second encoding means for encoding the source sequence according to the second error correction code to produce the second encoded sequence. The communications symbols processing means may include multiplexing means, responsive to the first and second encoding means, for multiplexing the first and second encoded sequences to produce a multiplexed sequence of symbols. Means may be provided, responsive to the multiplexing means, for processing the multiplexed sequence to produce the communications signal. According to one aspect, the encoding means further includes interleaving means for interleaving the source sequence to produce an interleaved source sequence, and one of the first and second encoding means is responsive to the encoding means for encoding the interleaved source sequence.

According to one embodiment, the selective recursive decoding means includes first soft output decoding means, responsive to the communications signal processing means, for decoding the first received sequence according to the first error correction code, and second soft output decoding means, responsive to the communications signal processing means, for decoding the second received sequence according to the second error correction code. The first soft output decoding means is responsive to the second soft output decoding means to decode the first received sequence according to the first error correction code augmented by a soft output produced by the second soft output decoding means to produce a first estimate of a symbol of the source sequence if a previous estimate of the symbol produced by the second soft output decoding means fails to satisfy a predetermined reliability criterion. The second soft output decoding means is responsive to the first soft output decoding means to decode the second received sequence according to the second error correction code augmented by a soft output produced by the first soft output decoding means to produce a second estimate of a symbol of the source sequence if a previous estimate of the symbol produced by the second soft output decoding means fails to satisfy a predetermined reliability criterion.

According to another embodiment, the system includes error detection encoding means for encoding the source sequence according to an error detection code to produce an error detection encoded sequence, while the encoding means includes means for encoding the error detection encoded sequence according to the first and second error correction codes to produce the first and second encoded sequences. The selective recursive decoding means includes first decoding means, responsive to the communications signal processing means, for decoding the first received sequence according to the first error correction code to produce an estimate of a symbol of the source sequence, second decoding means, responsive to the communications signal processing means, for decoding the second received sequence according to the second error correction code to produce an estimate of a symbol of the source sequence, and error detection decoding means, responsive to the first and second decoding means, for decoding an estimate produced by the first decoding means or by the second decoding means to thereby produce a reliability metric for the estimate. The first decoding means is responsive to the error detection decoding means to decode the first received sequence according to the first error correction code augmented by a reliability metric produced by the error detection decoding means to produce a first estimate of a symbol of the source sequence if the reliability metric produced by the error detection decoding means indicates that a previous estimate of the symbol produced by the second decoding means fails to satisfy a predetermined reliability criterion. The second decoding means is responsive to the error detection decoding means to decode the second received sequence according to the second error correction code augmented by a reliability metric produced by the error detection decoding means to produce a second estimate of a symbol of the source sequence if the reliability metric produced by the error detection decoding means indicates that a previous estimate of the symbol produced by the first decoding means fails to satisfy a predetermined reliability criterion.

According to another aspect of the invention, the selective recursive decoding means may include means for maximum likelihood decoding the first received sequence to produce a first estimate of a symbol of the source sequence and a path metric associated therewith. Means are provided, responsive to the means for maximum likelihood decoding, for decoding the second received sequence to produce a second estimate of the symbol if a predetermined function of the path metric associated with the first estimate is outside of a predetermined range. According to another aspect, the selective recursive decoding means includes means for maximum a posteriori (MAP) decoding the first received sequence to produce a first MAP estimate of a symbol of the source sequence and a reliability metric associated therewith, and means are provided, responsive to the means for MAP decoding, for decoding the second received sequence to produce a second estimate of the symbol if the reliability metric associated with the first MAP estimate is outside of a predetermined range.

The system may further includes means for nonrecursively decoding at least one of the first and second received sequences according to the associated error correction codes to produce estimates of a first group of symbols in the source sequence. The selective recursive decoding means may include means for recursively decoding the first and second received sequences to produce estimates of a second group of symbols of the source sequence. The second group of symbols may represent information of a greater importance than information represented by the first group of symbols, for example, the second group of symbols may include symbols of greater significance than symbols included in the first group of symbols. By nonrecursively decoding less important symbols, decoding may be achieved with fewer computations.

The system may also include error detection encoding means for encoding the source sequence according to an error detection code, e.g., a cyclic redundancy code (CRC), to produce an error detection encoded sequence, and the encoding means may include means for encoding the error detection encoded sequence according to the first and second error correction codes to produce the first and second encoded sequences. The selective recursive decoding means may include means for decoding the first received sequence according to the first error correction code to produce an estimate of a symbol of the source sequence, and means for decoding the estimate according to the error detection code to produce a reliability metric for the estimate.

According to another aspect, the selective recursive decoding means includes means for first decoding one of the received sequences having a preferred signal characteristic, e.g., a greater signal strength, associated therewith. Means for determining a respective signal characteristic for a respective one of the received sequences may also be provided. The selective recursive decoding means may also include means for decoding the first received sequence to produce a first estimate of a symbol of the source sequence, the first estimate having a reliability associated therewith, and means for decoding the second received sequence according to the second error correction code augmented by the first estimate of the symbol of the source sequence to produce a second estimate of the symbol if the first estimate of the symbol satisfies a first reliability criterion, and for decoding the second received sequence according to the second error correction code augmented by a predetermined reference value if the first estimate of the symbol satisfies a second reliability criterion. The first predetermined reliability criterion may represent a greater reliability than the second predetermined reliability criterion.

According to method aspects, a source sequence of symbols is communicated over a communications medium by encoding the source sequence according to respective first and second error correction codes to produce respective first and second encoded sequences of symbols. The first and second encoded sequences are processed to produce a communications signal, which is then communicated over the communications medium. The communicated communications signal is processed to produce first and second received sequences of symbols corresponding to the first and second encoded sequences, respectively. The first and second received sequences are selectively recursively decoded according to the associated error correction codes augmented by previous estimates of a symbol of the source sequence to repeatedly produce revised estimates of the symbol until an estimate satisfying a predetermined reliability criteria is obtained.

The first and second received sequences may be selectively recursively decoded by maximum likelihood decoding the first received sequence to produce a first estimate of a symbol of the source sequence and a path metric associated therewith, and decoding the second received sequence to produce a second estimate of the first symbol if a predetermined function of the path metric associated with the first estimate is outside of a predetermined range. Similarly, the received sequences may be selectively decoded by maximum a posteriori (MAP) decoding the first received sequence to produce a first MAP estimate of a symbol of the source sequence and a reliability metric associated therewith, and decoding the second received sequence to produce a second estimate of the first symbol if the reliability metric associated with the first MAP estimate is outside of a predetermined range. According to another method aspect, encoding of the source sequence according to the first and second error correction codes may be preceded by encoding the source sequence according to an error detection code, e.g., a CRC, and selective recursive decoding may include decoding the first received sequence according to the first error correction code to produce an estimate of a symbol of the source sequence, and then decoding the estimate according to the error detection code to produce the reliability metric for the estimate. The first received sequence may be decoded to produce a first estimate of a symbol of the source sequence and the second received sequence may then be decoded according to the second error correction code augmented by the first estimate of the symbol if the first estimate satisfies a first reliability criterion or according to the second error correction code augmented by a predetermined reference value if the first estimate satisfies a second reliability criterion. The first predetermined reliability criterion preferably represents a greater reliability than the second predetermined reliability criterion.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Figure 1:
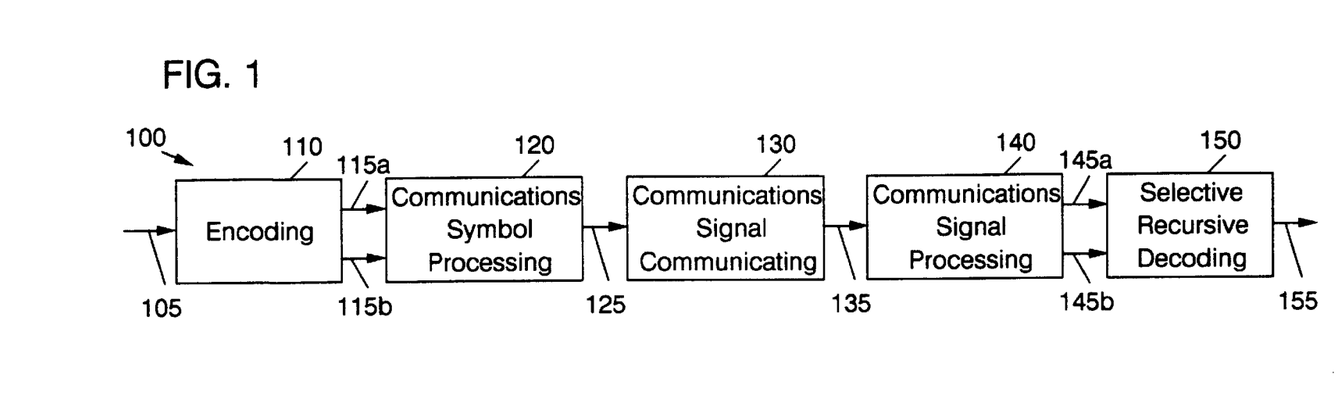
FIG. 1 illustrates a communications system according to the present invention.

FIG. 1 illustrates a communications system 100 according to the present invention. The communications system 100 includes encoding means 110 for encoding a source sequence of symbols 105 according to respective first and second error correction codes to produce respective first and second encoded sequences 115a, 115b. The first and second encoded sequences 115a, 115b are processed by communications symbol processing means 120 to produce a communication signal 125 which is communicated over a communications medium by communications signal communicating means 130. The communicated communications signal 135 is processed by communications signal processing means 140 to produce first and second received sequences 145a, 145b which correspond to the first and second encoded sequences 115a, 115b. To produce an estimate 155 of a symbol of the source sequence 150, selective recursive decoding means 150 recursively decode the first and second received sequences 145a, 145b according to the respective first and second error correction codes augmented by previous estimates of the symbol to repeatedly produce revised estimates of the symbol until an estimate of the symbol satisfying a predetermined reliability criterion, e.g., a symbol having an associated reliability metric within a predetermined range, is obtained.

Those skilled in the art will appreciate that the encoding means 110, the communication symbol processing means 120, communications signal communicating means 130, communications signal processing means 140, and selective recursive decoding means 150 may be implemented using a variety of hardware, software or combinations thereof. For example, the encoding means 110 may be implemented using software running on a computer, microprocessor or other data processing apparatus, firmware running on special purpose hardware such as digital signal processing (DSP) chips, or combinations thereof. The communications symbols processing means 120 may include such commonly used communications components as multiplexers, interleavers, digital to analog converters (D/As), modulators, and the like. Functions of the encoding means 110 and the communications symbols processing means 120 may, for example, be integrated in special purpose hardware and/or software such as an application specific integrated circuit (ASIC), or may be distributed among different components. Communications signal communicating means 130 may be implemented with commonly used communications components such as amplifiers, antennas, receivers, and the like which are appropriate for the communications medium used, e.g., a radio link, fiber optic link, coaxial cable and the like. The operations of these components are well-known to those skilled in the art and need not be described in greater detail herein.

Figure 2:
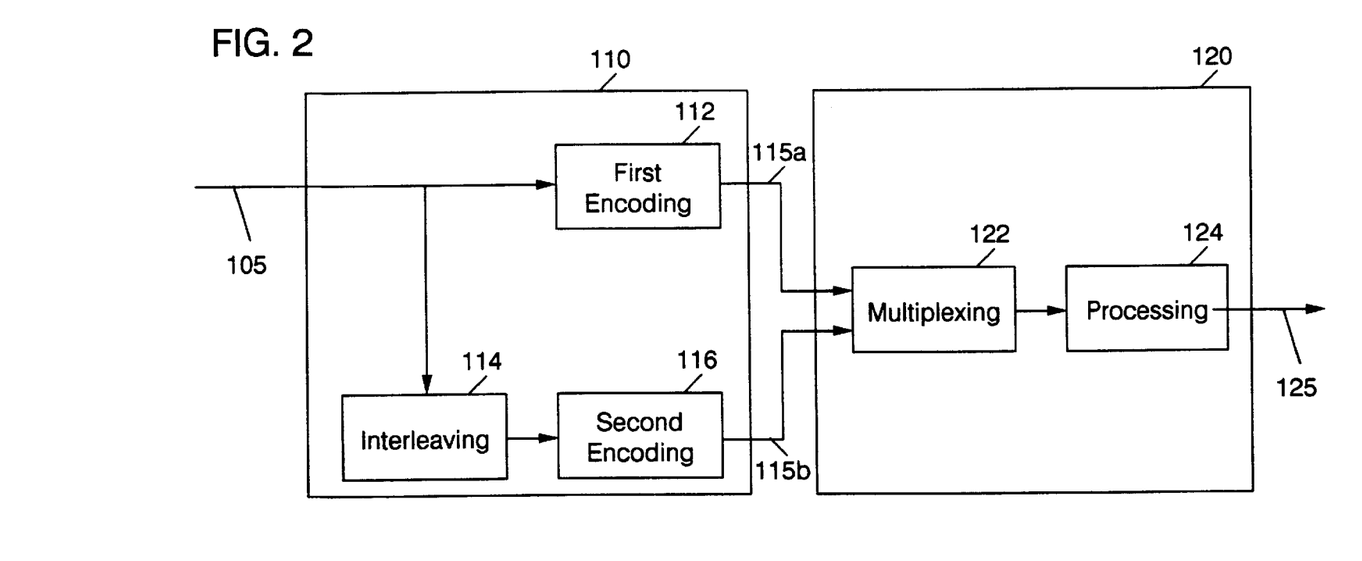
FIG. 2 illustrates parallel encoding according to an embodiment of a communications system according to the present invention.

According to preferred embodiments, the encoding means 110 and the communications symbol processing means 120 perform a parallel coding function which produces a communication signal 125 which represents a combination of separately encoded versions of the source sequence 105. Referring to FIG. 2, encoding means 110 is illustrated including first encoding means 112 for encoding the source sequence 105 according to a first error correction code. Second encoding means 116 is also provided for encoding the source sequence 105 according to a second error correction code, preferably after interleaving in interleaving means 114. The first and second encoded sequences 115a, 115b thereby produced are multiplexed in multiplexing means 122 and processed in processing means 124 to produce the communications signal 125. As described above, these elements of the encoding means 110 and the communications symbol processing means 120 may be implemented using special-purpose hardware, software running on special or general purpose data processors, or combinations thereof.

The communicated communications signal 135 is decoded using a selective recursive decoding scheme. According to one embodiment illustrated in FIG. 3, the communicated communications signal 135, which generally corresponds to the communications signal 125 subject to noise, fading and other disturbances introduced by the communications medium and/or the communications signal communicating means 130, is processed in communications signal processing means 140. In particular, the communicated signal 135 preferably is processed in processing means 142, e.g., a matched filter and associated sampler, to produce a sequence of symbols which is then demultiplexed in demultiplexing means 144, preferably according to the multiplexing sequence used in the communications symbol processing means 120, to produce the first and second received sequences 145a, 145b corresponding to the first and second encoded sequences 115a, 115b.

Figure 3:
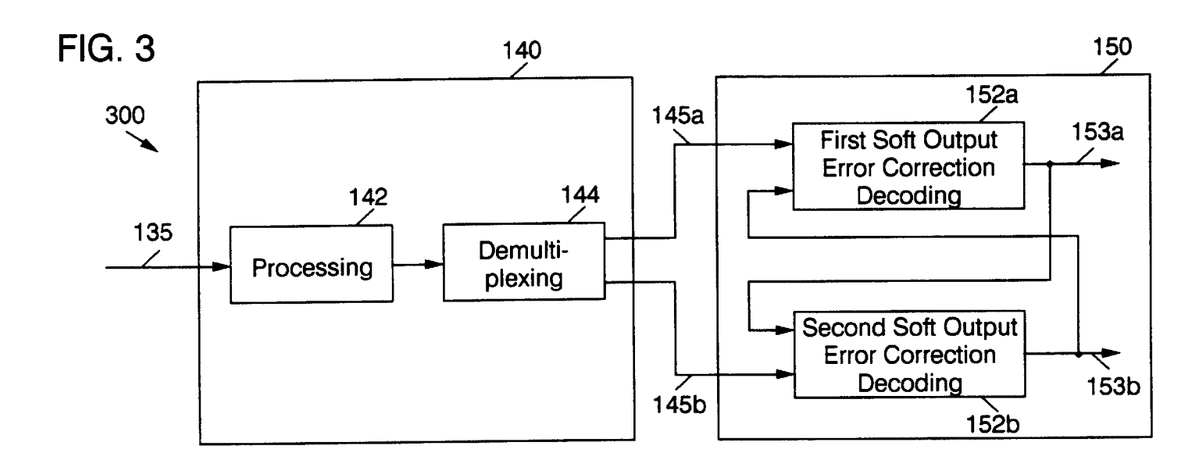
FIG. 3 illustrates selective recursive decoding according to an embodiment of a communications system according to the present invention.

For the embodiment of an apparatus 300 for decoding an encoded communications signal illustrated in FIG. 3, the selective recursive decoding means 150 includes first and second soft output decoding means 152a, 152b for decoding the respective first and second received sequences 145a, 145b according to the respective first and second error correction codes. Each of the first and second soft output decoding means 152a, 152b produces a soft output 153a, 153b indicating a reliability of a symbol estimate produced by the soft output decoding means 152a, 152b. The soft output 153a, 153b from a soft output decoding means 152a, 152b is fed back into the other decoding means 152a, 152b for use in augmenting the decoding of the first and second received sequences 145a, 145b.

Those skilled in the art will appreciate that the first and second soft output decoding means 152a, 152b may utilize a number of different decoding techniques or algorithms. For example, the first and second soft output decoding means 152a, 152b may employ a soft output decoder of the type described in U.S. patent application Ser. No. 08/699,101 now U.S. Pat. No. 5,968,198 to Hassan et al., commonly assigned to the assignee of the present invention. According to the decoder described therein, a maximum a posteriori (MAP) estimate is generated for a symbol which is to be decoded, and then a soft information value is produced for each bit position in the symbol, the soft information output providing an indication of the relative probabilities of a particular bit having a particular binary value. Other types of decoders which produce a soft information output which may be used with the present invention include, for example, a symbol estimator as described in "Optimal decoding of linear codes for minimizing symbol error rate," by Bahl et al, or a maximum likelihood sequence estimator utilizing a soft output Viterbi algorithm (SOVA) which produces path metrics, functions of which may be used to indicate a reliability for a symbol produced by the estimator. Those skilled in the art will also appreciate that for systems employing interleaving in conjunction with parallel encoding as in, for example, the illustrated embodiment of FIG. 2, the first and second soft output decoding means 152a, 152b may incorporate appropriate interleaving, deinterleaving, delay and other element needed to provide appropriate ordering of symbol estimates. Those skilled in the art will appreciate, however, that other parallel coding schemes which do not require similar interleaving, deinterleaving, delay and the like may be used with the present invention, for example, the parallel coding schemes described in the United States Patent Application entitled "Communications Systems and Methods Employing Parallel Coding Without Interleaving," now U.S. Pat. No. 5,983,385, to Hassan et al., assigned to the assignee of the present application and filed concurrently herewith.

Figure 4:
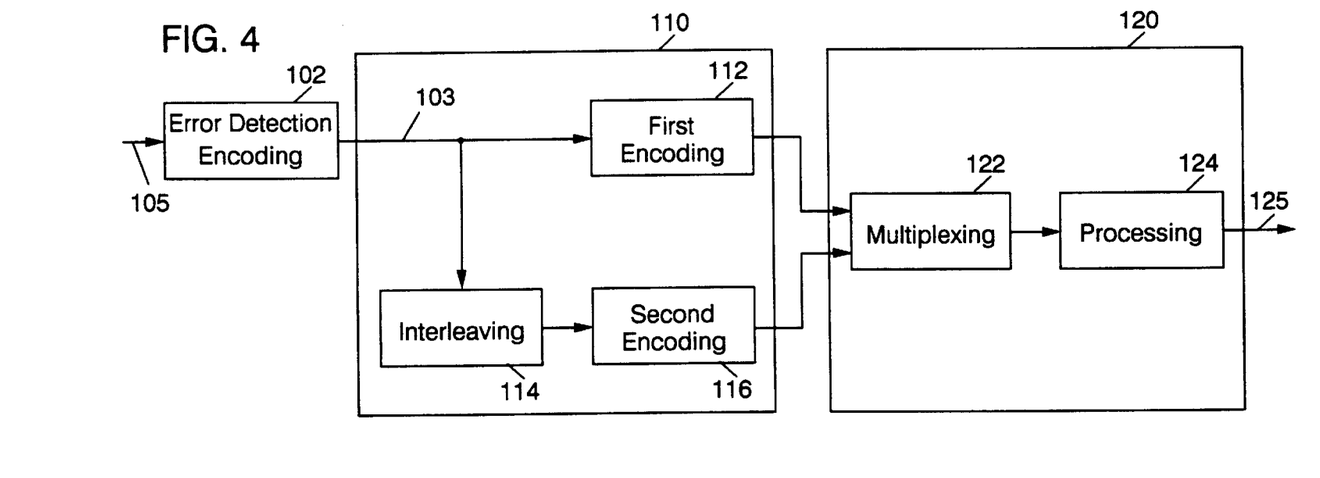
FIG. 4 illustrates parallel encoding with error detection according to another embodiment of a communications system according to the present invention.
Figure 5:
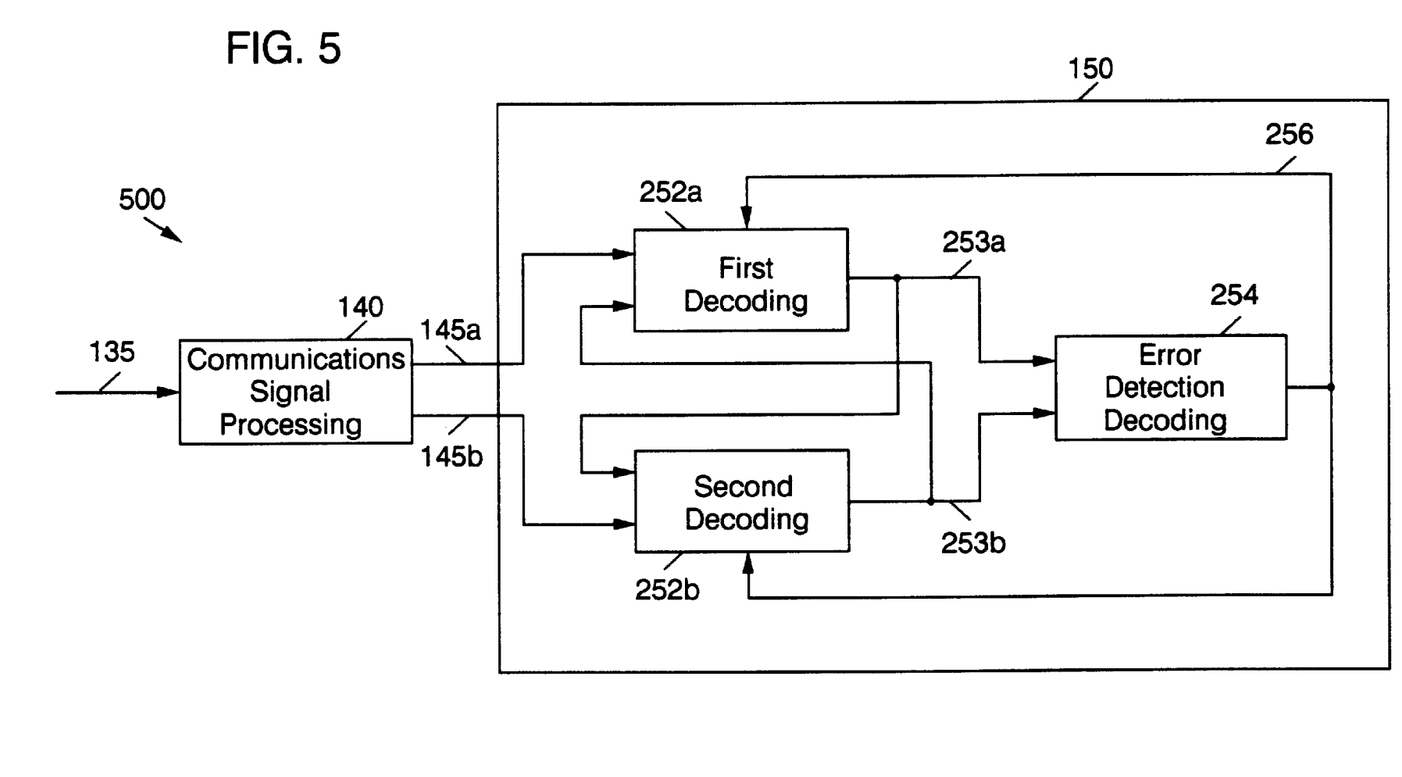
FIG. 5 illustrates selective recursive decoding according to another embodiment of a communications system according to the present invention.

Additional embodiments according to the present invention are illustrated in FIGS. 4 and 5. Error detection coding means 102 encodes the source sequence 105 according to an error detection code, e.g., a cyclic redundancy code (CRC), to produce a error detection encoded sequence 103. The error detection encoded sequence is then further encoded in encoding means 110 and processed in communications symbol processing means 120 to produce a communications signal 125, for example, as described with respect to FIG. 2. Referring to FIG. 5, an apparatus 500 for decoding a communicated communications signal 135 includes communications signal processing means 140 which processes the communicated communications signal 135 to produce first and second received sequences 145a, 145b as described above, which are then decoded in respective first and second decoding means 252a, 252b of the selective recursive decoding means 150 to produce symbol estimates 253a, 253b. To produce a reliability metric to guide recursive decoding in the first and second decoding means 252a, 252b, symbol estimates 253a, 253b are further decoded by error detection decoding means 254 according to the error detection code employed in the error detection encoding means 102 of FIG. 4 to produce reliability metrics 256 for the symbol estimates 253a, 253b. A respective one of the first and second decoding means 252a, 252b decodes the respective first and second received sequences 145a, 145b according to the first and second error correction codes to produce a symbol estimate 253a, 253b for a symbol in the source sequence 105, augmented by a reliability metric 256 produced for a previous estimate produced by the other of the first and second decoding means 252a, 252b.

Those skilled in the art will understand the first and second decoding means 252a, 252b may utilize a variety of hard decision or soft decision decoders. It will be appreciated that use of the error detection encoding, e.g., a relatively simple CRC, to generate reliability metrics allows the illustrated embodiment to utilize hard decision decoders which may be less complex than soft decision decoders. However, those skilled in the art will appreciate that soft decision decoders, for example, the soft output decoders described above may also utilized with the illustrated embodiment. Those skilled in the art will also appreciate that for systems employing interleaving in conjunction with parallel encoding as in, for example, the illustrated embodiment of FIG. 4, the first and second decoding means 252a, 252b may incorporate appropriate interleaving, deinterleaving, delay and other element needed to provide appropriate ordering of symbol estimates. Those skilled in the art will appreciate, however, that other parallel coding schemes which do not require similar interleaving, deinterleaving, delay and the like may be used with the present invention as described, for example, in the United States Patent entitled "Communications Systems and Methods Employing Parallel Coding Without Interleaving," discussed above.

Figure 6:
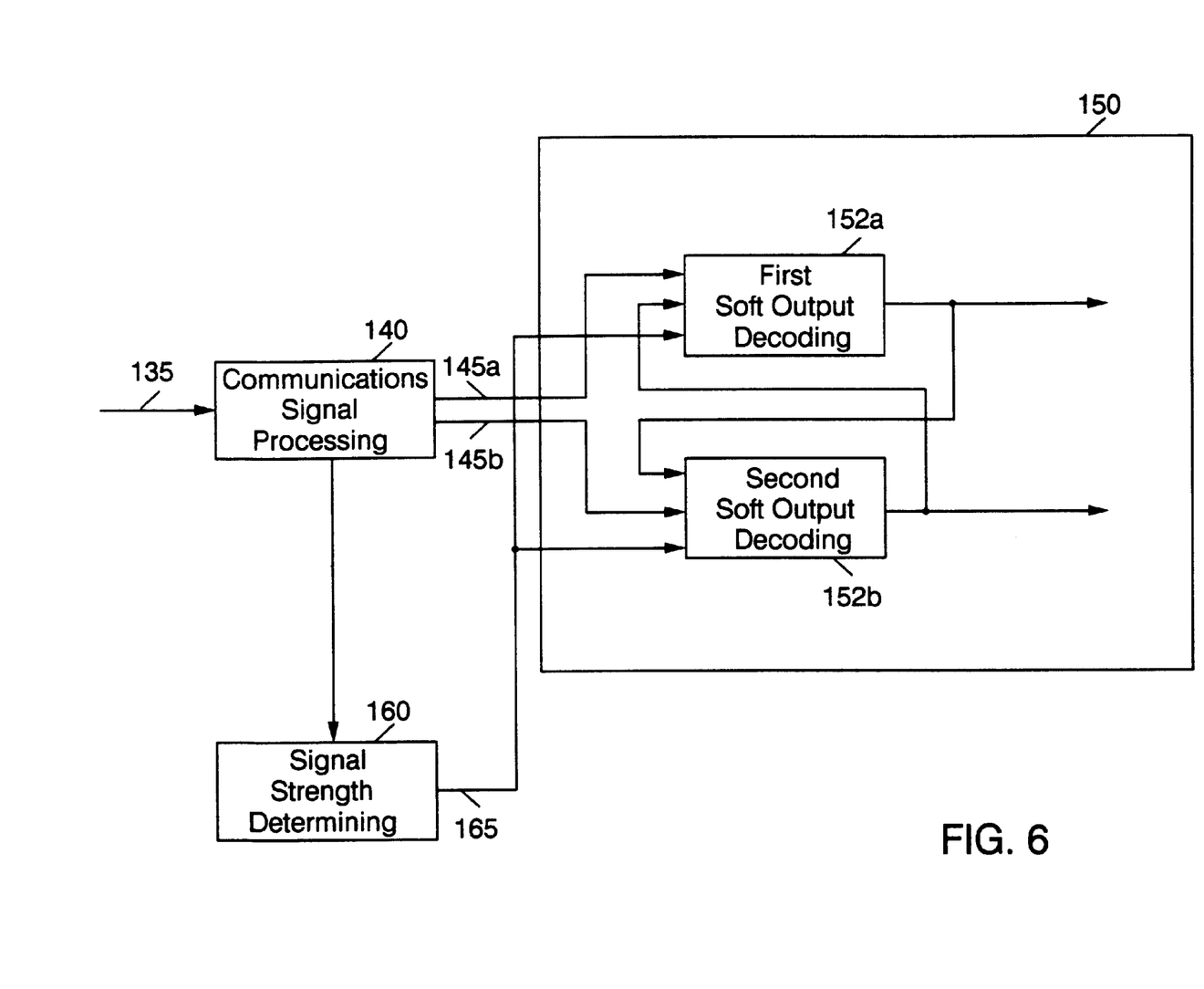
FIG. 6 illustrates selective recursive decoding according to another embodiment of a communications system according to the present invention.

FIG. 6 illustrates yet another embodiment of selective recursive decoding according to the present invention, in which means for determining a respective signal characteristic 165 for a respective one of the first and second received sequences 145a, 145b, for example, signal strength determining means 160 for determining a respective signal strength for a respective one of the first and second received sequences 145a, 145b, is provided to allow for more efficient decoding. In particular, the selective recursive decoding means 150 may use the signal characteristic 165 to determine which of the first and second decoding means 152a, 152b will first generate an estimate of a symbol in the source sequence 105. For example, by choosing one of the received sequences 145a, 154b having the greater signal strength associated therewith, an estimate of a symbol produced by the corresponding decoding means may have a higher reliability, thus potentially allowing a reduction in the number of decoding iterations required to produce an estimate having the desired reliability.

FIGS. 7–10 are flowchart illustrations of methods and apparatus for processing a communications signal to produce an estimated sequence of information symbols which represents an estimate of the source sequence of information symbols communicated by the communications signal. Those skilled in the art will understand that each block of the flowchart illustrations, and combinations of blocks in the flowchart illustrations, may be implemented with various commonly used communications system components. It will also be understood that portions of the operations described in the flowchart illustrations may be executed as computer program instructions loaded in a computer or other data processing apparatus, thus producing a machine which provides means for implementing the functions specified in the flowchart blocks and combinations thereof. The computer program may cause operational steps to be performed on the computer or data processing apparatus to produce a computer-implemented process such that the instructions which execute on the computer or data processing apparatus provide steps for implementing the functions of the flowchart blocks or combinations thereof. Accordingly, blocks of the flowchart illustrations support combinations of means for performing the specified functions and combinations of steps for performing the specified functions.

Figure 7:
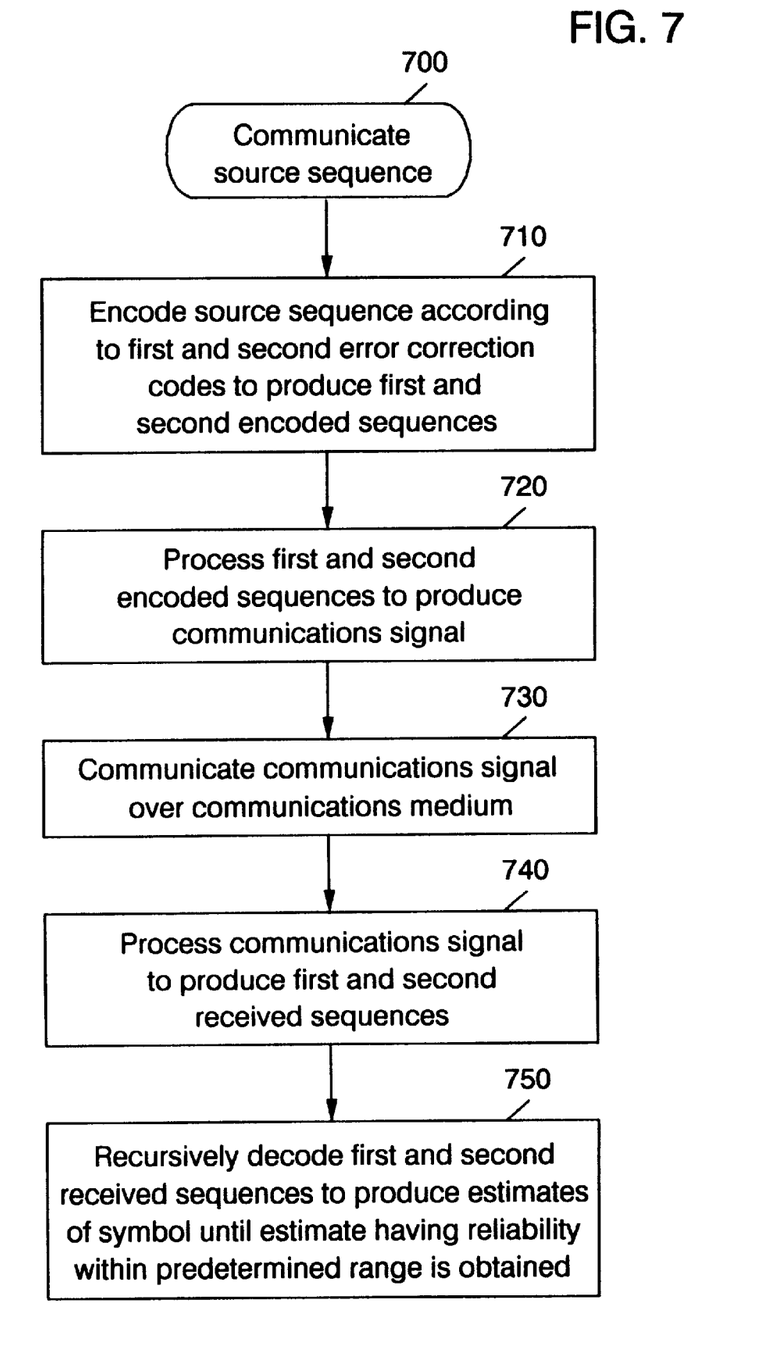
FIG. 7 illustrates operations for communicating a source sequence over a communications medium according to the present invention.

FIG. 7 illustrates operations for communicating a source sequence of symbols over a communications medium (Block 700). The source sequence is encoded according to respective first and second error correction codes to produce respective first and second encoded sequences (Block 710). The first and second sequences are processed to produce a communications signal (Block 720) which is then communicated over a communications medium (Block 730). The communicated communications signal, which may be subject to corruption due to noise, fading and other effects, is then processed to produce first and second received sequences corresponding to the first and second encoded sequences (Block 740). The first and second received sequences are then recursively decoded to produce estimates of a symbol of the source sequence until an estimate satisfying a predetermined reliability criterion is obtained (Block 750).

Figure 8:
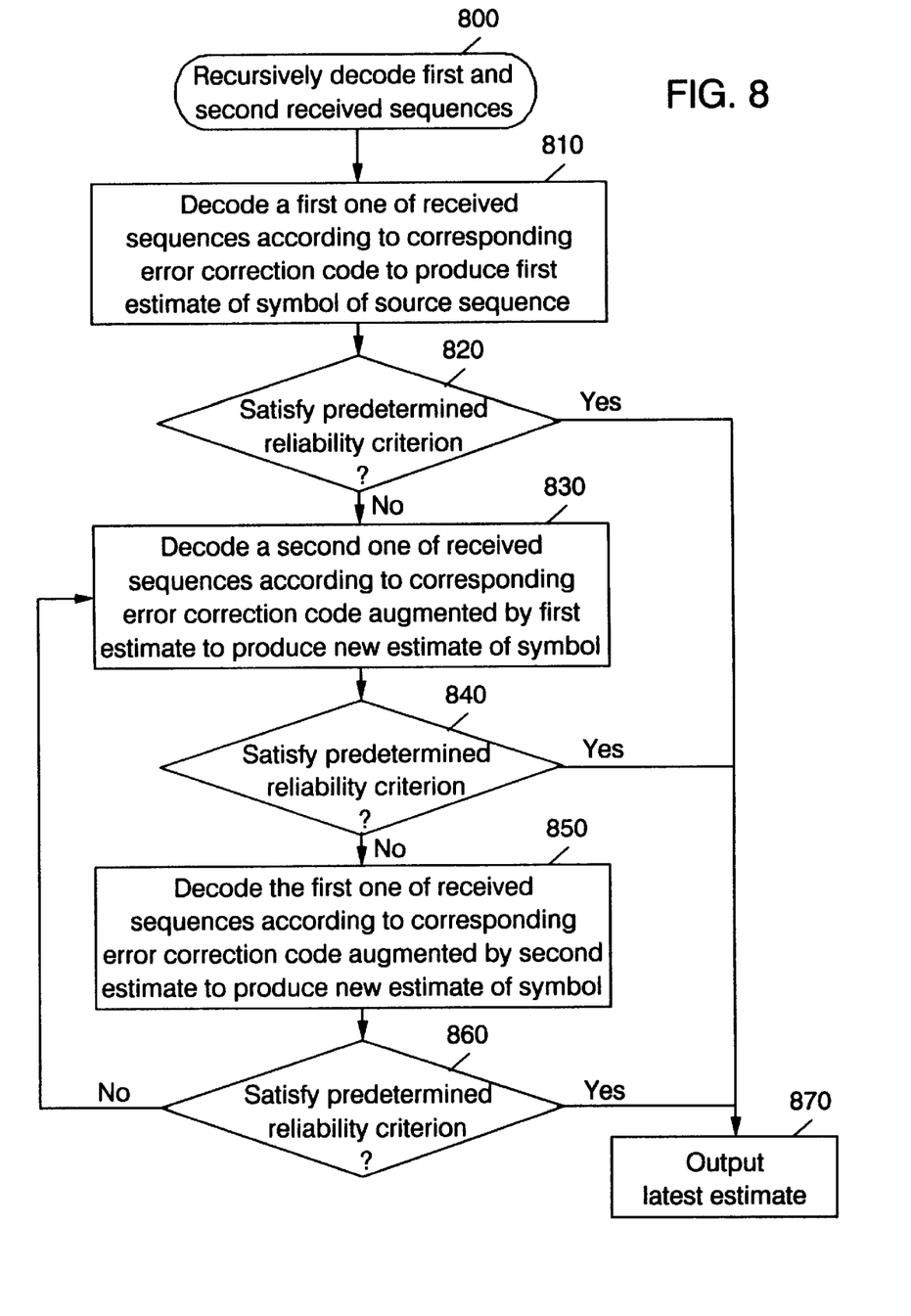
FIG. 8 illustrates selective recursive coding operations according to an aspect of the present invention.

Operations for selectively recursively decoding the first and second received sequences according to one aspect of the present invention are illustrated in FIG. 8 (Block 800). A first one of the received sequences is decoded according to the corresponding error correction code to produce a first estimate of a symbol of the source sequence (Block 810). If the first estimate satisfies a predetermined reliability criterion (Block 820), e.g., has a soft output value within a predetermined range, the first estimate may be output (Block 870). If the first estimate does not satisfy the predetermined reliability criterion, a second one of the received sequences is decoded according to its corresponding error code augmented by the first estimate of the symbol, to produce a second estimate of the symbol (Block 830). Those skilled in the art will appreciate that if the reliability of the first estimate is questionable, for example, if the first estimate has a reliability within a predetermined range which may cause the first estimate to incorrectly bias the second estimate, the second estimate may alternatively be produced by decoding the second one of the received sequences according to its corresponding error correction code augmented by a predetermined reference value. As with the first estimate, if the second estimate satisfies the predetermined reliability criterion (Block 840), it may be output. Otherwise, the first one of the received sequences is decoded again according to its corresponding error correction code, this time augmented by the second estimate of the symbol, to produce a new estimate of the symbol (Block 850). The reliability of the estimate is tested (Block 860), with new estimates being generated until an estimate satisfying the predetermined reliability criterion is produced.

An example of how an output of one decoder can be used to augment a second decoder will now be explained with reference to FIGS. 4 and 5. Assuming systematic encoding, let x denote information bits of a source sequence 105, y denote parity bits produced by the first encoding means 112 and z denote parity bits produced by the second encoding means 116. At the decoding apparatus 500, a demodulator may produce sequences $\hat{x}$, $\hat{y}$, and $\hat{z}$, corresponding to x, y, and z. The first decoding means 252a processes $\hat{x}$ and $\hat{y}$, augmented by information from the second decoding means 252b, and the second decoding means 252b processes $\hat{x}$ and $\hat{z}$, augmented by information from the first decoding means 252a.

In particular, the first decoding means 252a accepts sequences $\hat{x}$ and $\hat{y}$, in addition to bias information $L_j^{(2)}$ from the second decoding means 252b. The first time the first decoding means 252a operates, $L_j^{(2)}$ may not be available, and thus may be replaced by a value "1" for all j. From $L_j^{(2)}$ the first decoding means 252a first computes:

$$q_j^{(2)}(0) = \frac{L_j^{(2)}}{(1 + L_j^{(2)})}$$

and $$q_j^{(2)}(1) = 1 - q_j^{(2)}.$$

The first decoding means 252a next computes a likelihood ratio $l_i^{(1)}$ for bit $x_i$:

$$l_i^{(1)} = \frac{\sum_{x:x_i=0} \prod_j p(\hat{x}_j | x_j) \prod_k p(\hat{y}_k | y_k) \prod_l q_l^{(2)}(x_l)}{\sum_{x:x_i=1} \prod_j p(\hat{x}_j | x_j) \prod_k p(\hat{y}_k | y_k) \prod_l q_l^{(2)}(x_l)},$$

where $p(\hat{x}_j|x_j)$ and $p(\hat{y}_k|y_k)$ may depend on a channel model. From the viewpoint of the first decoding means 252a, a value $l_i^{(1)}>1$ indicates that $x_i=0$ and a value $l_i^{(1)} \leq 1$ indicates that $x_i=1$,. The first decoding means 252a also computes "intrinsic" information $$M_i^{(1)} = \frac{p(\hat{x}_i | x_i = 0)}{p(\hat{x}_i | x_i = 1)},$$

and "extrinsic" information $$L_i^{(1)} = \frac{l_i^{(1)}}{M_i^{(1)}}.$$

The second decoding means 252b may operate similarly, accepting sequences $\hat{x}$ and $\hat{z}$, as well as bias information $L_j^{(1)}$ from the first decoding means 252a. The second decoding means 252b may compute $l_i^{(2)}$ and $L_i^{(2)}$ in the same manner that the first decoding means 252a computes $l_i^{(1)}$ and $L_i^{(1)}$. From the viewpoint of the second decoding means 252b, a value $l_i^{(2)}>0$ indicates that $x_i=0$, and a value $l_i^{(2)} \leq 0$ indicates that $x_i=1$. The second decoding means 252b sends extrinsic information $L_i^{(2)}$ as bias information to the first decoding means 252a. Monotonic functions of the log-likelihood, intrinsic and extrinsic information may also be used instead of the above expressions. An example of monotonic function is the natural logarithm.

Figure 9:
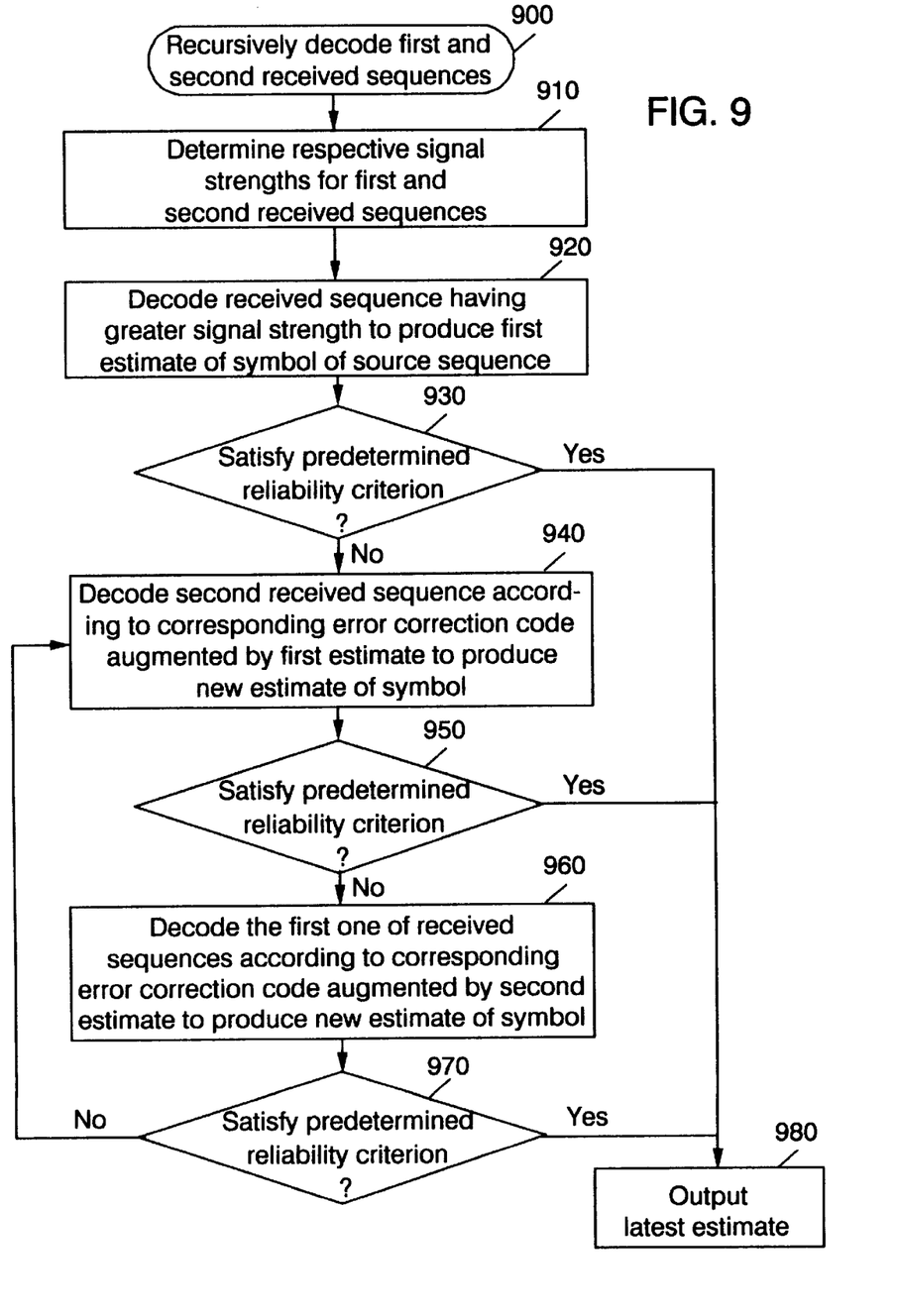
FIG. 9 illustrates selective recursive decoding operations according to another aspect of the present invention.

In a variation on the operations illustrated in FIG. 9, FIG. 8 illustrates operations (Block 900) for decoding the first and second received sequences wherein decoding is guided by a determination of a signal characteristic for each of the received sequences, here shown as a signal strength (Block 910). The received sequence having the greater signal strength is first decoded according to its corresponding error correction code to produce a first estimate of a symbol in the source sequence (Block 920). If the first estimate satisfies a predetermined reliability criterion (Block 930), the estimate may be output (Block 980). If not, a second one of the received sequences is decoded according to its corresponding error correction code augmented by the first estimate or, alternatively, a predetermined reference value, to produce a new estimate of the symbol (Block 940). As with the first estimate, if the new estimate satisfies the predetermined reliability criterion (Block 950), it may be output (Block 980). If not, this estimate is used to generate a new estimate of the symbol from the first one of the received sequences (Block 960), the reliability of which is in turn tested (Block 970) to determine if further decoding is necessary.

Those skilled in the art will appreciate that the operations of FIGS. 8 and 9 may include other steps, for example, interleaving or deinterleaving appropriate to compensate for interleaving in the original encoding of the communications signal. Those skilled in the art will also appreciate that additional processing such as additional interleaving, encoding or decoding may also be practiced with the present invention.

Figure 10:
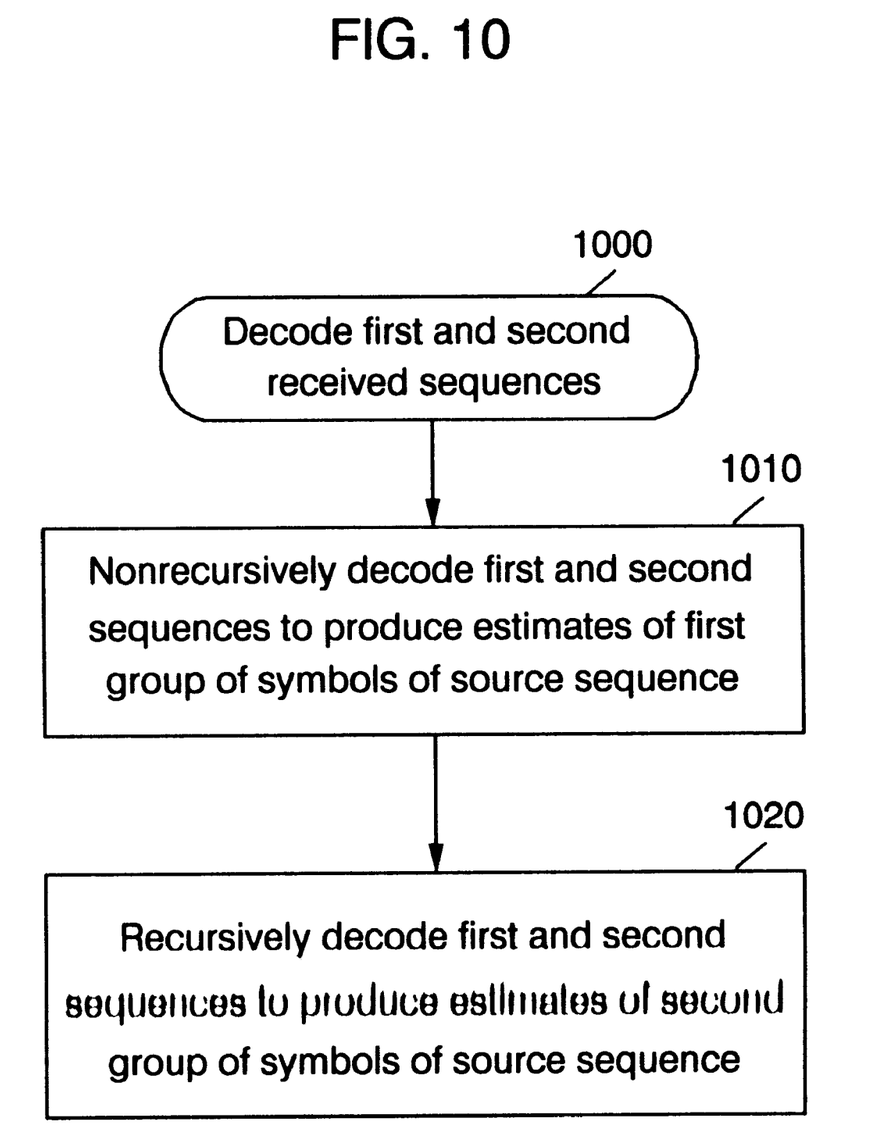
FIG. 10 illustrates combined recursive and nonrecursive decoding operations according to another aspect of the present invention.

FIG. 10 illustrates a aspect of the present invention whereby only selected symbols of the source sequence are iteratively estimated. According to this embodiment, operations for decoding the first and second received sequences (Block 1000) include nonrecursively decoding at least one of the first and second sequences to produce estimates of a first group of symbols in the source sequence (Block 1010). For example, one of the first and second sequences could be decoded, for example, by using a signal strength criterion as described in reference to FIGS. 6 and 9, to produce an estimate for a symbol from the first group. The symbols from the first group might include, for example, less significant bits of voice or other data. As accuracy may not be particularly important for these bits, they may be nonrecursively decoded in order to reduce computational overhead. The first and second received sequences may be selectively recursively decoded (Block 1020), as described above, to produce more accurate estimates of a second group of symbols of the source sequence, for example, more significant bits of a data stream.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. An apparatus for decoding a communications signal which represents a source sequence encoded according to respective first and second error correction codes which produce respective first and second encoded sequences which are multiplexed to produce the communications signal, the apparatus comprising:

communications signal processing means for processing the communications signal to produce first and second received sequences of symbols corresponding to the first and second encoded sequences, respectively; and selective recursive decoding means, responsive to said communications signal processing means, for selectively recursively decoding the first and second received sequences according to the respective first and second codes augmented by previous estimates of a symbol of the source sequence to repeatedly produce revised estimates of the symbol until a revised estimate satisfying a predetermined reliability criterion is obtained, wherein said selective recursive decoding means nonrecursively decodes at least one of the first and second received sequences according to the respective error correction codes to produce estimates of a first group of symbols in the source sequence and wherein said selective recursive decoding means recursively decodes the first and second received sequences to produce estimates of a second group of symbols of the source sequence.

2. An apparatus according to claim 1, wherein said selective recursive decoding means comprises:

means for maximum likelihood decoding the first received sequence to produce a first estimate of a symbol of the source sequence and a path metric associated therewith; and means, responsive to said means for maximum likelihood decoding, for decoding the second received sequence to produce a second estimate of the symbol if a predetermined function of the path metric associated with the first estimate is outside of a predetermined range.

3. An apparatus according to claim 1, wherein said selective recursive decoding means comprises:

means for maximum a posteriori (MAP) decoding the first received sequence to produce a first MAP estimate of a symbol of the source sequence and a reliability metric associated therewith; and means, responsive to said means for MAP decoding, for decoding the second received sequence to produce a second estimate of the symbol if the reliability metric associated with the first MAP estimate is outside of a predetermined range.

4. An apparatus according to claim 1, wherein accuracy is of greater importance for information represented by said second group of symbols than it is for information represented by the first group of symbols.

5. An apparatus according to claim 4, wherein said source sequence includes symbols ranging from a least significant symbol to a most significant symbol, and wherein said second group of symbols includes symbols of greater significance than symbols included in the first group of symbols.

6. An apparatus according to claim 1, wherein said selective recursive decoding means comprises:

means for decoding the first received sequence to produce a first estimate of a symbol of the source sequence, the estimate having a reliability associated therewith; and means for decoding the second received sequence according to the second error correction code augmented by the estimate of the symbol of the source sequence to produce a second estimate of the symbol if the first estimate satisfies a first predetermined reliability criterion, and for decoding the second received sequence according to the second error correction code augmented by a predetermined reference value to produce the second estimate if the first estimate of the symbol satisfies a second predetermined reliability criterion.

7. An apparatus according to claim 6, wherein said first predetermined reliability criterion represents a greater reliability than said second predetermined reliability criterion.

8. An apparatus according to claim 1, wherein said selective recursive decoding means comprises soft output decoding means for decoding at least one of the first and second received sequences to produce a soft output indicating a reliability of an estimate of a symbol of the source sequence.

9. An apparatus according to claim 8, wherein said selective recursive decoding means comprises:

first soft output decoding means, responsive to said communications signal processing means, for decoding the first received sequence according to the first error correction code; and second soft output decoding means, responsive to said communications signal processing means, for decoding the second received sequence according to the second error correction code;

wherein said first soft output decoding means is responsive to said second soft output decoding means to decode the first received sequence according to said first error correction code augmented by a soft output produced by said second soft output decoding means to produce a first estimate of a symbol of the source sequence if a previous estimate of the symbol produced by said second soft output decoding means fails to satisfy a predetermined reliability criterion, and wherein said second soft output decoding means is responsive to said first soft output decoding means to decode the second received sequence according to said second error correction code augmented by a soft output produced by said first soft output decoding means to produce a second estimate of a symbol of the source sequence if a previous estimate of the symbol produced by said second soft output decoding means fails to satisfy a predetermined reliability criterion.

10. An apparatus for decoding a communications signal which represents a source sequence encoded according to respective first and second error correction codes which produce respective first and second encoded sequences which are multiplexed to produce the communications signal, the apparatus comprising:

communications signal processing means for processing the communications signal to produce first and second received sequences of symbols corresponding to the first and second encoded sequences, respectively; and selective recursive decoding means, responsive to said communications signal processing means, for selectively recursively decoding the first and second received sequences according to the respective first and second codes augmented by previous estimates of a symbol of the source sequence to repeatedly produce revised estimates of the symbol until a revised estimate satisfying a predetermined reliability criterion is obtained, wherein said selective recursive decoding means decodes an estimate of the symbol of the source sequence according to an error detection code to produce the reliability metric for the estimate.

11. An apparatus according to claim 10, wherein the error detection code comprises a cyclic redundancy code (CRC).

12. An apparatus according to claim 10, wherein said selective recursive decoding means comprises:

first decoding means, responsive to said communications signal processing means, for decoding the first received sequence according to said first error correction code to produce an estimate of a symbol of the source sequence; and second decoding means, responsive to said communications signal processing means, for decoding the first received sequence according to the first error correction code to produce an estimate of a symbol of the source sequence; and error detection decoding means, responsive to said first and second decoding means, for decoding an estimate produced by said first decoding means or by said second decoding means to thereby produce a reliability metric for the estimate, wherein said first decoding means is responsive to said error detection decoding means to decode the first received sequence according to said first error correction code augmented by a reliability metric produced by said error detection decoding means to produce a first estimate of a symbol of the source sequence if the reliability metric produced by said error detection decoding means indicates that a previous estimate of the symbol produced by said second decoding means fails to satisfy a predetermined reliability criterion, and wherein said second decoding means is responsive to said error detection decoding means to decode the second received sequence according to said second error correction code augmented by a reliability metric produced by said error detection decoding means to produce a second estimate of a symbol of the source sequence if the reliability metric produced by said error detection decoding means indicates that a previous estimate of the symbol produced by said first decoding means fails to satisfy a predetermined reliability criterion.

13. An apparatus for decoding a communications signal which represents a source sequence encoded according to respective first and second error correction codes which produce respective first and second encoded sequences which are multiplexed to produce the communications signal, the apparatus comprising:

communications signal processing means for processing the communications signal to produce first and second received sequences of symbols corresponding to the first and second encoded sequences, respectively; and selective recursive decoding means, responsive to said communications signal processing means, for selectively recursively decoding the first and second received sequences according to the respective first and second codes augmented by previous estimates of a symbol of the source sequence to repeatedly produce revised estimates of the symbol until a revised estimate satisfying a predetermined reliability criterion is obtained, wherein said selective recursive decoding means comprises means for first decoding one of the first and second received sequences having a preferred signal characteristic associated therewith.

14. An apparatus according to claim 13, further comprising means for determining a respective signal characteristic for a respective one of the received sequences.

15. An apparatus according to claim 13, wherein said means for first decoding one of the received sequences having a preferred signal characteristic associated therewith comprises means for first decoding one of the received sequences having a greater signal strength.

16. An apparatus according to claim 15, further comprising means for determining a respective signal strength for a respective one of the received sequences.

17. A method of decoding a communications signal which represents a source sequence encoded according to respective first and second error correction codes which produce respective first and second encoded sequences which are multiplexed to produce the communications signal, the method comprising the steps of:

processing the communications signal to produce first and second received sequences of symbols corresponding to the first and second encoded sequences, respectively;

selectively recursively decoding the first and second received sequences according to the respective error correction codes augmented by previous estimates of a symbol of the source sequence to repeatedly produce revised estimates of the symbol until an estimate satisfying a predetermined reliability criteria is obtained, wherein said step of selectively recursively decoding comprises nonrecursively decoding at least one of the first and second received sequences according to the respective error correction code to produce estimates of a first group of symbols in the source sequence and recursively decoding the first and second received sequences to produce estimates of a second group of symbols of the source sequence.

18. A method according to claim 17, wherein said step of selectively recursively decoding comprises the steps of:

maximum likelihood decoding the first received sequence to produce a first estimate of a symbol of the source sequence and a path metric associated therewith; and decoding the second received sequence to produce a second estimate of the first symbol if a predetermined function of the path metric associated with the first estimate is outside of a predetermined range.

19. A method according to claim 17, wherein said step of selectively recursively decoding comprises the steps of:

maximum a posteriori (MAP) decoding the first received sequence to produce a first MAP estimate of a symbol of the source sequence and a reliability metric associated therewith; and decoding the second received sequence to produce a second estimate of the first symbol if the reliability metric associated with the first MAP estimate is outside of a predetermined range.

20. A method according to claim 17, wherein accuracy is of greater importance for information represented by said second group of symbols than it is for information represented by the first group of symbols.

21. A method according to claim 20, wherein said source sequence includes symbols ranging from a least significant symbol to a most significant symbol, and wherein said second group of symbols includes symbols of greater significance than symbols included in the first group of symbols.

22. A method according to claim 17, wherein said step of selectively recursively decoding comprises the steps of:

decoding the first received sequence to produce a first estimate of a symbol of the source sequence; and decoding the second received sequences according to the second error correction code augmented by the first estimate of the symbol if the first estimate satisfies a first reliability criterion, and decoding the second received sequence according to the second error correction code augmented by a predetermined reference value if the first estimate satisfies a second reliability criterion.

23. A method according to claim 22, wherein the first predetermined reliability criterion represents a greater reliability than the second predetermined reliability criterion.

24. A method of decoding a communications signal which representing an error detection encoded source sequence that is encoded according to respective first and second error correction codes which produce respective first and second encoded sequences which are multiplexed to produce the communications signal, the method comprising the steps of:

processing the communications signal to produce first and second received sequences of symbols corresponding to the first and second encoded sequences, respectively selectively recursively decoding the first and second received sequences according to the respective error correction codes augmented by previous estimates of a symbol of the error detection encoded source sequence to repeatedly produce revised estimates of the symbol until an estimate satisfying a predetermined reliability criterion is obtained, wherein said step of selectively recursively decoding comprises     decoding an estimate of the symbol of the error detection encoded source sequence according to the error detection code to produce the reliability metric for the estimate.

25. A method according to claim 24 wherein the error detection code comprises a cyclic redundancy code (CRC).

26. A method of decoding a communications signal which represents a source sequence encoded according to respective first and second error correction codes which produce respective first and second encoded sequences which are multiplexed to produce the communications signal, the method comprising the steps of:

processing the communications signal to produce first and second received sequences of symbols corresponding to the first and second encoded sequences, respectively; and     selectively recursively decoding the first and second received sequences according to the respective first and second codes augmented by previous estimates of a symbol of the source sequence to repeatedly produce revised estimates of the symbol until a revised estimate satisfying a predetermined reliability criterion is obtained, wherein said step of selectively recursively decoding comprises first decoding one of the first and second received sequences having a preferred signal characteristic associated therewith.

27. A method according to claim 26, wherein first decoding one of the first and second received sequences having a preferred signal characteristic is preceded by determining respective signal characteristics for respective ones of the first and second received sequences.

28. A method according to claim 26, wherein first decoding one of the received sequences having a preferred signal characteristic associated therewith comprises first decoding one of the received sequences having a greater signal strength.

29. A method according to claim 28, wherein first decoding one of the received sequences having a greater signal strength is preceded by determining respective signal strengths for respective ones of the received sequences.

* * * * *